United States Patent [19]

Tsunoda et al.

[11] Patent Number: 4,877,714

[45] Date of Patent: Oct. 31, 1989

[54] PHOTOSENSITIVE AQUEOUS EMULSION RESIN COMPOSITION OF POLYSTYRENE OR STYRENE COPOLYMER PARTICLES CONTAINING PHOTOSENSITIVE MATERIAL

[75] Inventors: Tahahiro Tsunoda; Tsuguo Yamaoka, both of Funabashi; Seiji Arimatsu, Neyagawa, all of Japan

[73] Assignee: Nippon Paint Company, Osaka, Japan

[21] Appl. No.: 236,636

[22] Filed: Aug. 25, 1988

Related U.S. Application Data

[63] Continuation of Ser. No. 40,173, Apr. 17, 1987, abandoned, which is a continuation of Ser. No. 893,257, Aug. 4, 1986, abandoned, which is a continuation of Ser. No. 719,703, Apr. 4, 1985, abandoned, which is a continuation of Ser. No. 641,099, Aug. 15, 1984, abandoned, which is a continuation of Ser. No. 470,718, Feb. 28, 1983, abandoned, which is a continuation of Ser. No. 233,571, Feb. 11, 1981, abandoned.

[30] Foreign Application Priority Data

Feb. 15, 1980 [JP] Japan .................................. 55-18169

[51] Int. Cl.$^4$ ................................................ G03C 1/76

[52] U.S. Cl. ..................................... 430/270; 430/138; 430/196; 430/197; 430/281

[58] Field of Search ............... 430/281, 278, 138, 196, 430/197, 270

[56] References Cited

U.S. PATENT DOCUMENTS 4,099,973  7/1978  Miura et al. ........................ 430/270
4,125,700 11/1978  Graham ........................... 274/159.16
4,273,551  6/1981  Muzyczok et al. ................. 430/175
4,277,611  6/1981  Vyvial et al. ....................... 430/281
4,284,707  8/1981  Nagasawa et al. .................. 430/196

Primary Examiner—Jack P. Brammer
Attorney, Agent, or Firm—Niro, Scavone, Haller & Niro

[57] ABSTRACT

A photosensitive resin composition which comprises as an essential component a resin emulsion comprising resin particles, which do not make coalescence to form a continuous film when the resin emulsion is applied on a substrate and dried, obtained by subjecting a polymerizable composition comprising at least one polymerizable vinyl monomer and at least one of a photo-reactive compound and a photo-initiator dissolved therein to emulsion polymerization.

4 Claims, No Drawings

PHOTOSENSITIVE AQUEOUS EMULSION RESIN COMPOSITION OF POLYSTYRENE OR STYRENE COPOLYMER PARTICLES CONTAINING PHOTOSENSITIVE MATERIAL

This application is a continuation of Ser. No. 040,173 filed Apr. 17, 1986 (now abandoned) which is a continuation of Ser. No. 893,257 filed Aug. 4, 1986 (now abandoned) which is a continuation of Ser. No. 719,703 filed Apr. 4, 1985 (now abandoned) which is a continuation of Ser. No. 641,099 filed Aug. 15, 1984 (now abandoned) which is a continuation of Ser. No. 470,718 filed Feb. 28, 1983 (now abandoned) which is a continuation of Ser. No. 233,571 filed Feb. 11, 1981 (now abandoned).

The present invention relates to a photosensitive resin composition. More particularly, it relates to a photosensitive resin composition useful as a photosensitive material for plate-making which possesses a water-developability and affords excellent ink-receptivity, wear-strength and acid-resistance in a printing image portion.

In photosensitive materials for plate-making, it is required that the photosensitive resin composition corresponding to either unexposed parts or exposed parts is eliminated by developement, and the remaining printing image portion is resistant against an etching solution or can receive an oily ink in the presence of water to make a print image. The former is the case of a photo resist for letter-press plate or deep etch plate and the latter is the case of lithography.

As such photosensitive materials for plate-making, photosensitive solutions containing diazo compounds such as o-quinonediazide or diazo resins are widely employed. However, in the case of a photosensitive solution containing o-quinonediazide, development must be carried out by alkaline solution, and in the case of diazo resin which has a water-developability, the wear-strength of the image portion is so small as to require reinforcement with lacquer.

In plates requiring the printing durability, solvent-developable photosensitive resins such as polyvinyl cinnamate and polyesters obtained by condensation of phenylenediacrylic acid and bifunctional hydroxy derivatives are usually employed.

As the result of an extensive study, it has now been found that the use of an aqueous emulsion of a self-photosensitive polymer whose particles contain a photo-reactive compound or a photo-initiator can afford a photosensitive resin composition which is water-developable and can give excellent ink-receptivity, water-strength and acid-resistance in the printing image portion and which has a higher sensitivity owing to a crosslinking of polymers in comparison with conventional polymers obtained by cross-linking of monomers. The principle or reaction mechanism causing the manifestation of such excellent quality of the photosensitive resin composition is not yet clarified.

There is known a photosensitive resin composition obtained by admixing a resin emulsion showing no photosensitivity with a water-soluble diazo compound. In this composition, hardening with ultraviolet light is caused by the reaction between the diazo compound and a hydroxyl group-containing polymer (e.g. polyvinyl alcohol) as a protective colloid to make an ether linkage.

In the photosensitive resin composition of the invention, polymer particles having an increased strength owing to intramolecular crosslinking are further combined together by intermolecular crosslinking, and the thus formed film is highly elastic. Further, the photosensitive resin composition of the invention shows an excellent storability, because a photo-reactive compound or photo-initiator having a good storability can be employed therein.

According to the present invention, there is provided a photosensitive resin composition which comprises as an essential component a resin emulsion comprising resin particles, which do not make coalescence to form a continuous film when the resin emulsion is applied on a substrate and dried, obtained by subjecting a polymerizable composition comprising at least one polymerizable vinyl monomer and at least one of a photo-reactive compound and a photo-initiator dissolved therein to emulsion polymerization.

The resin emulsion may be prepared by subjecting a polymerizable composition comprising at least one polymerizable vinyl monomer and at least one of a photo-reactive compound and a photo-initiator dissolved therein to emulsion polymerization.

As the vinyl monomer to be used to the invention, there may be employed any one conventionally used for emulsion polymerization. Specific examples are styrene, vinyl acetate, acrylic acid, methacrylic acid, alkyl acrylate, alkyl methacrylate, etc. Among them, the use of styrene is the most preferable. Usually, a mixture comprising styrene and/or vinyl acetate as the main components with or without other copolymerizable monomers (e.g. acrylic acid, methacrylic acid, alkyl acrylate, alkyl methacrylate) is employed.

As the photo-reactive compound, there may be employed any one soluble in the vinyl monomer to be used. Specific examples includes azides (e.g. p-azidobenzaldehyde, p-azidobenzoic acid, p-azidobenzalacetophenone, p-azidobenzalacetone) and bisazides (e.g. 2,6-di(4'-azidobenzal)-cyclohexanone, 2,6-di(4'-azidobenzal)-4-methylcyclohexanone, 4,4'-diazidochalcone, di(4-azidobenzal)acetone, di(4-azidostyryl)acetone, di(4-azidobenzal)acetone-2-sulfonic acid, di(4-azidobenzal)acetone-2,2'-disulfonic acid, 4,4'-diazidostilbene-2,2'-disulfonic acid). These may be used alone or in combination.

The photo-initiator may be any one soluble in the vinyl monomer. Specific examples are aromatic ketones such as benzophenone, benzyl, benzoin and benzoin alkyl ether. These may be used solely or in combination.

The photosensitive resin composition of the invention is composed of a resin emulsion composition which is obtained by emulsion polymerization of vinyl monomers in which the photo-reactive compound and/or the photo-initiator is dissolved.

In case of the sole use of the photo-reactive compound, its amount may be usually from 1 to 20% by weight, preferably from 1 to 10% by weight, to the total weight of the vinyl monomer(s). When the amount is less than 1% by weight, the sensitivity of the ultimate photosensitive resin composition is insufficient. When it exceeds 20% by weight, the strength of the film formed by the use of said photosensitive resin composition after photo-crosslinking tends to become small. In case of the sole use of the photo-initiator, its amount may be usually from 0.1 to 20% by weight, preferably from 0.1 to 10% by weight, to the total weight of the vinyl monomer(s). When the amount deviates from this range, the same disadvantage as seen in the use of the photo-reactive compound is caused. In case of the combined use of the photo-reactive compound with the photo-initiator, the sum of their amounts is desired to be not more than 20% by weight to the total weight of the vinyl monomer(s) for the same reason as in their sole use.

The resin emulsion to be produced as a result of emulsion polymerization is required to be such that the resin particles therein do not make coalescence to form a continuous film when the resin emulsion is applied on a substrate and dried. In order to meet such requirement, it is necessary to set the minimum film-forming temperature to be not lower than 10° C., preferably from 15° to 100° C. The kind(s) and amount(s) of the vinyl monomer(s) to be subjected to emulsion polymerization are thus appropriately chosen so as to realize the said minimum film-forming temperature. A typical example of the combination of the vinyl monomers is a mixture of styrene, vinyl acetate and ethyl acrylate in a weight proportion of 40–100:0–40:0–40. While styrene may be used alone, its combined use with vinyl acetate and/or ethyl acrylate requires to contain styrene in 40% or more on the basis of the total weight of the vinyl monomers; otherwise, the resin emulsion will not be formed or its stability will be inferior. The same disadvantageous phenomenon as above may be produced when the content of either one of vinyl acetate and ethyl acrylate is more than 40%.

The emulsion polymerization may be effected in a per se conventional manner. For example, the polymerizable composition comprising the vinyl monomer(s) and the photo-reactive compound and/or the photo-initiator dissolved therein is heated at 75° to 85° C. for 2 to 5 hours in the presence of a protective colloid, an emulsifier and a reaction initiator in the atmosphere of an inert gas. Examples of the protective colloid are polyvinyl alcohol, polyvinylpyrrolidone, hydroxycellulose, polyacrylamide and polymethacrylamide. As the emulsifier, a cationic, anionic or nonionic one may be employed. Examples of the reaction initiator are persulfates, bisulfites, etc.

The thus prepared resin emulsion may be as such used as a photosensitive resin composition. When desired, any conventional additive may be incorporated therein.

The photosensitive resin composition is usually applied onto a substrate such as a metal sheet or a plastic film, followed by drying at room temperature to give a photosensitive resin plate.

When the photosensitive resin plate is irradiated with a ultraviolet light through a transparent negative film, the photosensitive resin composition at the part(s) exposed to the light is hardened and becomes insoluble in water. The photosensitive resin composition at the part(s) not exposed to the light is not hardened and washed out with water. The thus developed plate possesses a high acid-resistance and is usable as a photoresist for letterpress plate or deep etch plate, a resist for screen printing or the like. It can receive an oily ink in the presence of water and shows an excellent wear-strength so that it is usable as an offset PS plate for lithography requiring a high printing durability.

The present invention will be hereinafter explained further in detail by the following Examples, wherein part(s) and % are by weight unless otherwise indicated.

EXAMPLE 1

Into a glass vessel equipped with a stirring apparatus, a thermometer, a tube for introduction of nitrogen and a reflux condenser, water (30 parts), a 10% aqueous solution of polyvinyl alcohol ("Gohsenol NH-17" manufactured by The Nippon Synthetic Chemical Industry Co., Ltd.) (14 parts) as a protective colloid and sodium laurylsulfate (1 part) as an emulsifier were charged, and the contents were stirred well while introducing nitrogen therein. The temperature was elevated up to 40° C., and a part (10%) of a solution of 2,6-di(4'-azidobenzal)-4-methylcyclohexanone (0.5 part) in styrene (4 parts) was added thereto. The temperature was further elevated under stirring. When the temperature reached 50° C., a part (about 10%) of a solution of potassium persulfate (0.1 part) as an initiator in water (5 parts) and a part (about 10%) of a solution of sodium bisulfite (0.1 part) as an initiator in water (5 parts) were added thereto. When the temperature reached 65° C., the rest of the above mentioned styrene solution was added, and then a mixture of vinyl acetate (3 parts) and ethyl acrylate (3 parts) and the rest of the above mentioned solutions of the initiators were added dropwise so as to keep the temperature in a range of 75° to 80° C. After completion of the addition, the temperature was elevated up to 80° to 85° C., and stirring was continued for about 3 hours. Then, the reaction mixture was cooled to room temperature to obtain a resin emulsion.

The thus obtained resin emulsion was applied to a grained aluminum plate by the aid of a whirler and dried at room temperature. After allowed to stand overnight, the plate was irradiated by a chemical lamp of 1.2 $mJ/cm^2$.sec through a negative film for 5 minutes, developed with water and then dried with warm air to obtain a clear positive image. After gumming up, an oily ink for offset was rubbed onto the plate surface in the presence of water whereby the ink adhered only to the printing image portion. The thus treated plate was set into an offset printing machine, and printing was carried out. The plate showed a printing durability of about 150,000 copies, Separately, the above obtained resin emulsion was applied to a copper plate or a zinc plate, and the light-exposure through a positive pattern, the development and the drying with warm air were effected in the same manner as above. Then, the copper plate was dipped into an aqueous solution of ferric chloride with Baumé's degree of 40 for 5 minutes, or the zinc plate was dipped into 10% nitric acid for 2 minutes, whereby corrosion occured only at the non-printing image portion, and the printing image portion showed an excellent acid-resistance.

Further, separately, the above obtained resin emulsion was applied to a grained aluminum plate, a copper plate or a zinc plate, and after drying, the plate was kept in a dark place at room temperature for 6 months. The thus treated plate was subjected to the printing and etching tests as mentioned above whereby the results were quite the same as obtained immediately after the application and drying. Thus, an excellent storability was confirmed.

EXAMPLE 2

Into the same glass vessel as in Example 1, water (100 parts), a 10% aqueous solution of polyvinyl alcohol ("Gohsenol NM-14" manufactured by The Nippon Synthetic Chemical Industry Co., Ltd.) (30 parts) as a protective colloid and sodium laurylsulfate (2 parts) as an emulsifier were charged, and the contents were stirred well while introducing nitrogen therein. The temperature was elevated up to 40° C., and a part (10%) of a solution of benzophenone (0.6 part) in styrene (10 parts) was added thereto. Then, the temperature was further elevated while stirring. When the temperature reached 50° C., a part (about 10%) of a solution of potassium persulfate (0.2 part) as an initiator in water (5 parts) and a part (about 10%) of a solution of sodium bisulfite (0.2 part) as an initiator in water (5 parts) were added thereto. When the temperature reached 65° C., the rest of the said styrene solution and the rest of the said solutions of the initiators were added dropwise thereto so as to keep the temperature in a range of 75° to 80° C. After completion of the addition, the temperature was elevated up to 80° to 85° C., and stirring was continued for about 3 hours. Then, the reaction mixture was cooled to room temperature to obtain a resin emulsion.

The thus obtained resin emulsion was applied to a grained aluminum plate anodized and/or subjected to hydrophilic treatment by the aid of a whirler and dried at room temperature. After allowed to stand overnight, the plate was irradiated by the aid of a chemical lamp of 1.2 mJ/cm$^2$·sec through a negative film for 20 seconds, developed with water and dried with warm air to obtain a clear positive image. After gumming up, oily ink for offset was rubbed onto the plate surface in the presence of water whereby the ink adhered only to the printing image portion. The thus treated plate was set into an offset printing machine, and printing was carried out. The plate showed a printing durability of about 150,000 copies.

The tests for acid-resistance and storability gave the same results as in Example 1.

EXAMPLES 3 TO 14

In the same manner as in Example 1 or 2, emulsion polymerization was effected by the use of the monomers as shown in Table 1 to obtain a resin emulsion, which was subjected to the same tests as in Example 1. In all of the resin emulsions, the water-developability, the printing durability, the acid-resistance and the storability were on the same level as in Example 1 or 2.

What is claimed is:

1. A photosensitive aqueous emulsion consisting essentially of an aqueous medium and a sufficient amount of polymeric resin particles dispersed in said medium to form said emulsion; said polymeric resin particles being formed by emulsion polymerization of monomers selected from styrene in an amount not less than 40% by weight of said polymeric resin, vinyl acetate in an amount not more than 40% by weight of said polymeric resin, and ethyl acrylate in an amount not more than 40% by weight of said polymeric resin; said polymeric resin particles also containing at least one member present in said emulsion polymerization and selected from the group consisting of (i) a photo-reactive compound chosen from water-insoluble azides and bisazides in an amount of about 1–20% by weight of said polymeric resin, and (ii) a photo-initiator chosen from aromatic ketones in an amount of about 0.1–20% by weight of said polymeric resin, with the total content of said photo-reactive compound and said photo-initiator being not more than 20% by weight of said polymeric resin; and said photosensitive aqueous emulsion having a minimum film-forming temperature of not lower than 10° C. whereby said resin particles do not coalesce into a continuous film when said emulsion is applied to a substrate and dried.

2. The photosensitive aqueous emulsion of claim 1 wherein said polymeric resin particles contain only said photo-reactive compound in an amount of about 1–20% by weight of said polymeric resin.

3. The photosensitive aqueous emulsion of claim 1 wherein said polymeric resin particles contain only said photo-initiator in an amount of about 0.1–20% by weight of said polymer resin.

4. The photosensitive aqueous emulsion of claim 1 wherein said polymeric resin of said polymeric resin particles consists essentially of styrene.

* * * * *

TABLE 1

| Example No. | Photo-reactive compound or photo-initiator (amount (part(s)) | Vinyl monomer into which photo-reactive compound or photo-initiator was dissolved (amount (part(s)) | Other monomers (amount (part(s)) |
|---|---|---|---|
| 3 | 2,6-Di(4'-azidobenzal)-4-methylcyclohexanone (0.3) | Styrene (10) | — |
| 4 | 2,6-Di(4'-azidobenzal)-4-methylcyclohexanone (1.0) | Styrene (6) | Vinyl acetate (2) Ethyl acrylate (2) |
| 5 | 2,6-Di(4'-azidobenzal)-4-methylcyclohexanone (0.3) | Styrene (4) | Vinyl acetate (3) Acrylic acid (3) |
| 6 | 2,6-Di(4'-azidobenzal)-4-methylcyclohexanone (0.3) | Styrene (6) | Vinyl acetate (2) Ethyl acrylate (2) |
| 7 | 2,6-Di(4'-azidobenzal)-cyclohexanone (0.3) | Styrene (6) | Vinyl acetate (2) Ethyl acrylate (2) |
| 8 | p-Azidobenzalacetone (0.3) | Styrene (6) | Vinyl acetate (2) Ethyl acrylate (2) |
| 9 | Di(4-azidobenzal)acetone (0.3) | Styrene (6) | Vinyl acetate (2) Ethyl acrylate (2) |
| 10 | Benzophenone (0.05) | Styrene (6) | Vinyl acetate (2) Ethyl acrylate (2) |
| 11 | Benzophenone (0.1) | Styrene (6) | Vinyl acetate (2) Ethyl acrylate (2) |
| 12 | Benzophenone (0.6) | Styrene (10) | — |
| 13 | Benzoin isopropyl ether | Styrene (10) | — |
| 14 | Benzoin (0.6) | Styrene (6) | Vinyl acetate (2) Ethyl acrylate (2) |